(12) United States Patent
Masunaga et al.

(10) Patent No.: US 11,239,314 B2
(45) Date of Patent: Feb. 1, 2022

(54) SEMICONDUCTOR DEVICE AND METHOD OF MANUFACTURING THE SAME

(71) Applicant: HITACHI, LTD., Tokyo (JP)

(72) Inventors: Masahiro Masunaga, Tokyo (JP); Akio Shima, Tokyo (JP); Shintaroh Sato, Tokyo (JP); Ryo Kuwana, Tokyo (JP)

(73) Assignee: HITACHI, LTD., Tokyo (JP)

( * ) Notice: Subject to any disclaimer, the term of this patent is extended or adjusted under 35 U.S.C. 154(b) by 0 days.

(21) Appl. No.: 16/265,455

(22) Filed: Feb. 1, 2019

(65) Prior Publication Data

US 2019/0326393 A1 Oct. 24, 2019

(30) Foreign Application Priority Data

Apr. 18, 2018 (JP) .............................. JP2018-079593

(51) Int. Cl.
| | |
|---|---|
| *H01L 29/66* | (2006.01) |
| *H01L 29/06* | (2006.01) |
| *H01L 23/535* | (2006.01) |
| *H01L 29/10* | (2006.01) |
| *H01L 29/417* | (2006.01) |
| *H01L 29/16* | (2006.01) |
| *H01L 29/45* | (2006.01) |

(Continued)

(52) U.S. Cl.
CPC ........ *H01L 29/0653* (2013.01); *H01L 23/535* (2013.01); *H01L 29/0847* (2013.01); *H01L 29/1095* (2013.01); *H01L 29/1608* (2013.01); *H01L 29/41758* (2013.01); *H01L 29/45* (2013.01); *H01L 29/66068* (2013.01); *H01L 21/02164* (2013.01); *H01L 21/02271* (2013.01); *H01L 21/02378* (2013.01); *H01L 21/02529* (2013.01); *H01L 21/02634* (2013.01); *H01L 21/046* (2013.01); *H01L 21/049* (2013.01); *H01L 21/0485* (2013.01); *H01L 29/78* (2013.01)

(58) Field of Classification Search
CPC combination set(s) only.
See application file for complete search history.

(56) References Cited

U.S. PATENT DOCUMENTS

| | | | |
|---|---|---|---|
| 6,444,554 B1* | 9/2002 | Adachi | H01L 29/40114 438/587 |
| 2003/0102516 A1* | 6/2003 | Sambonsugi | H01L 27/1112 257/393 |

(Continued)

FOREIGN PATENT DOCUMENTS

JP  H0555475 A  3/1993

*Primary Examiner* — Moin M Rahman
(74) *Attorney, Agent, or Firm* — Volpe Koenig

(57) ABSTRACT

A MOSFET that has a drain region and a source region on an upper surface of a semiconductor substrate and a gate electrode that is formed on the semiconductor substrate, and an element separation insulating film that includes an opening portion which exposes an active region, on the semiconductor substrate, are formed. At this point, a gate leading-out interconnection that overlaps the element separation insulating film when viewed from above, and that is integrally combined with the gate electrode is formed in a position where the gate leading-out interconnection does not extend over a distance between both the drain region and the source region when viewed from above, on a region that is exposed from the gate electrode.

13 Claims, 11 Drawing Sheets

(51) Int. Cl.
    *H01L 29/08*     (2006.01)
    *H01L 29/78*     (2006.01)
    *H01L 21/02*     (2006.01)
    *H01L 21/04*     (2006.01)

(56) References Cited

U.S. PATENT DOCUMENTS

| | | | |
|---|---|---|---|
| 2010/0059810 A1* | 3/2010 | Homma | H01L 27/11 257/324 |
| 2015/0132938 A1* | 5/2015 | Ahmed | H01L 21/28176 438/591 |
| 2016/0035623 A1* | 2/2016 | Shao | H01L 23/485 257/774 |
| 2016/0086961 A1* | 3/2016 | Owada | H01L 27/11546 438/258 |
| 2019/0027524 A1* | 1/2019 | Sato | H01L 27/14665 |
| 2019/0267229 A1* | 8/2019 | Isogai | H01L 21/02271 |

* cited by examiner

2: DRAIN REGION  
3: SOURCE REGION  
4: GATE ELECTRODE  
9: ELEMENT SEPARATION INSULATING FILM  
16: GATE LEADING-OUT INTERCONNECTION

SEMICONDUCTOR DEVICE AND METHOD OF MANUFACTURING THE SAME

BACKGROUND OF THE INVENTION

Field of the Invention

The present invention relates to a semiconductor device and a method of manufacturing the semiconductor device, and particularly to a semiconductor device that is subject to exposure to a high-radiation dose environment.

Background Art

At present, most of the industrial products that are manufactured employ a semiconductor element of which material is silicon (hereinafter referred to as Si). With the advancement of Si technology, the performance of the semiconductor element has been greatly improved. On the other hand, because a general-purpose Si device cannot find application in products that are subject to exposure to a harsh environment such as a high-radiation field, a semiconductor element that operates under the harsh environment is expected to be developed.

JP-A-5-55475 discloses an element separation insulating film that fills up a groove is formed in an upper surface of a semiconductor substrate and a metal oxide semiconductor field effect transistor (MOSFET) that is separated by the element separation insulating film.

SUMMARY OF THE INVENTION

In a case where a semiconductor device is illuminated with a radioactive ray, there is a problem in that trapped electric charge gathers up in an insulating film. With this electric charge, a defect occurs at an interface between the semiconductor substrate and the insulating film and thus an amount of leakage current due to the defect increases. It is easy for the trapped electric charge to gather up particularly in a region where the insulating film is thick, and between a gate electrode and the semiconductor substrate. Therefore, in a case where the gate electrode is formed on the element separation insulating film over a distance between a source region and a drain region, there occurs a problem in that it is easy for an interface defect to occur and thus leakage current flows between the source region and the drain region under the gate electrode.

An object and a novel feature of the present invention are apparent from the present specification and the accompanying drawings.

Among embodiments that are disclosed in the present application, an outline of a typical embodiment is briefly described as follows.

In a semiconductor device according to the typical embodiment, in a transistor having a source region and a drain region that are formed on an upper surface of the semiconductor substrate and a gate electrode the semiconductor substrate, a gate leading-out interconnection that overlaps an element separation insulating film on a semiconductor substrate and is integrated with a gate electrode is positioned at a position that is separated from the source region or the drain region when viewed from above.

According to the typical embodiment, the reliability of the semiconductor device can be improved. Particularly, leakage current can be prevented from occurring due to trapped electric charge that is accumulated in the insulating film as a result of exposure to a γ ray.

DETAILED DESCRIPTION OF THE INVENTION

Figure 1:
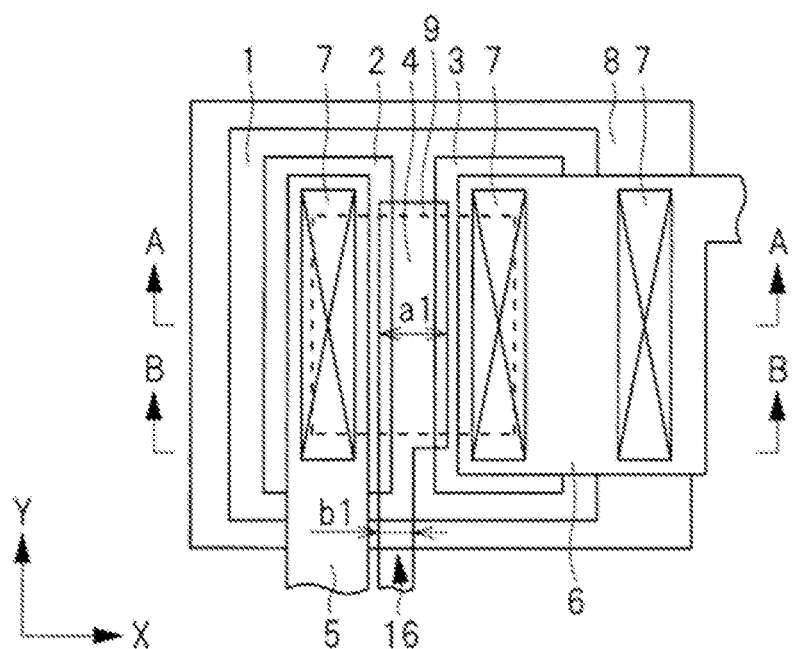
FIG. 1 is a plan-view diagram illustrating a semiconductor device according to a first embodiment of the present invention.

Embodiments according to the present invention will be in detail described in detail below with reference to the drawings. It is noted that in all the drawings for describing the embodiments, components that have the same function are given the same reference numeral, and that the repeated description thereof is omitted. Furthermore, in the embodiment, except when particularly necessary, as a rule, a description of the same or similar components is not repeated.

Furthermore, signs "−" and "+" indicates a relative concentration of impurities that have n-type or p-type conductivity. For example, in the case of the n-type impurities, the concentration of impurities increases in this order: "$n^-$", "n", and "$n^+$".

First Embodiment

Structure of a Semiconductor Device

Prevention of occurrence of leakage current due to radiation exposure and improvement of the reliability of a semiconductor device in the semiconductor device that is used in an environment where the radiation exposure takes place will be described below.

Figure 2:
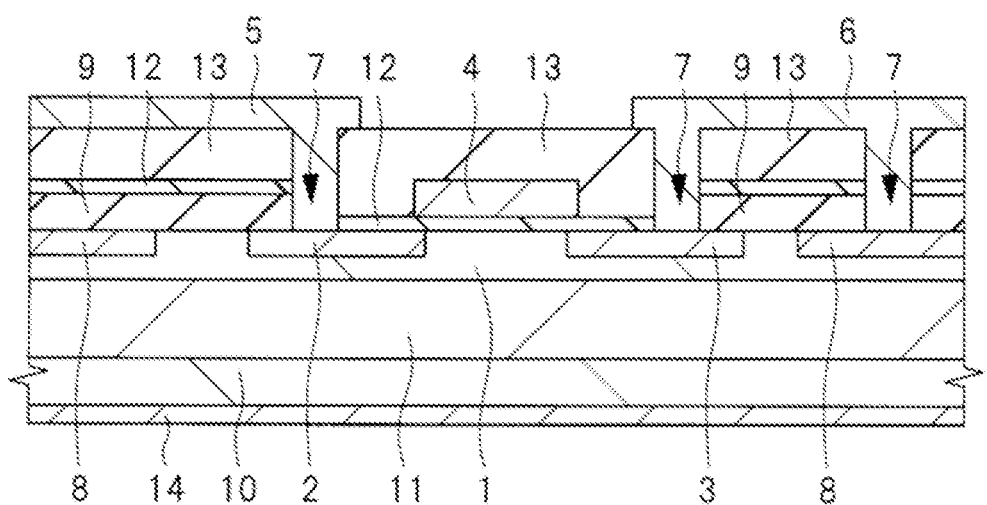
FIG. 2 is a cross-sectional diagram taken along line A-A in FIG. 1.
Figure 3:
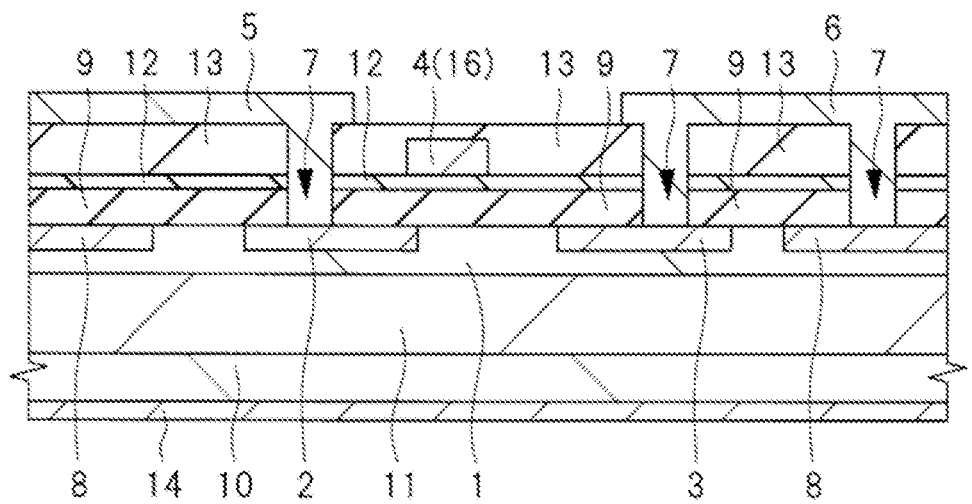
FIG. 3 is a cross-sectional diagram taken along line B-B in FIG. 1.

FIG. 1 is a plan-view diagram of a semiconductor device according to a first embodiment of the present invention. FIGS. 2 and 3 each illustrate a cross-sectional diagram of the semiconductor device according to the present embodiment. FIG. 2 is a cross-sectional diagram cut along line A-A in FIG. 1. FIG. 3 is a cross-sectional diagram cut along line B-B in FIG. 1. FIG. 3 is a cross-sectional diagram illustrating plugs in source and drain regions and a gate leading-out interconnection. In plan-view diagrams in the present application include FIG. 1, only an outline of a gate electrode is illustrated and thus a structure below the gate electrode is illustrated in a transparent manner. Furthermore, in FIG. 1, only an outline of an element separation insulating film is illustrated, a structure below an element separation insulating film is illustrated in a manner that makes the element separation insulating film transparent. FIG. 1 illustrates an outline of an opening portion that passes through the element separation insulating film, using a broken line. This is also the same for the other plan-view diagrams. That is, an active region is inside a region that is surrounded by a broken line which is illustrated in figures, and the element separation insulating film is formed outside the region that is surrounded by the broken line. Furthermore, FIG. 1 does not illustrate a gate insulating film and an inter-layer insulating film.

At this point, an n channel-type MOSFET is described, but the present invention can also find application in a p channel-type MOSFET. The p channel-type MOSFET can be formed by inverting a type of conductivity of each semiconductor layer of the n channel-type MOSFET, which will be described below. This is not limited to the present embodiment and is the same for the other embodiments that will be described below.

As illustrated in FIGS. 1 and 2, the semiconductor device according to the present embodiment has a semiconductor substrate that is made of silicon carbide (SiC) that is a wide band gap material. More precisely, the semiconductor substrate is made of a material that has a wider band gap than silicon (Si). Formed on an upper surface of the semiconductor substrate is a Metal Oxide Semiconductor Field Effect Transistor (MOSFET) that is a semiconductor element. That is, the semiconductor device according to the present embodiment is a silicon carbide semiconductor device. In this manner, the semiconductor substrate has a principal surface (an upper surface) and a rear surface (a lower surface) that is opposite in direction to the main surface, and a plurality of MOSFETs are formed to be arranged side by side in the vicinity of the principal surface. It is noted that only one MOSFET is illustrated in FIGS. 1 to 3. The principal surface of the semiconductor substrate is hereinafter referred to as the upper surface of the semiconductor substrate.

The semiconductor substrate is configured as a multilayer substrate that is made from an n-type SiC substrate 10 and an n-type epitaxial layer (a semiconductor layer) 11 which is formed on the SiC substrate 10. At this point, the multilayer substrate that includes the SiC substrate 10 and the epitaxial layer 11 is referred to the semiconductor substrate. Formed on an upper surface of the epitaxial layer 11 is a well 1 that is a p-type semiconductor region. The well 1 is formed, over a distance from the upper surface of the epitaxial layer 11 up to the middle of the depth of the epitaxial layer 11, within the epitaxial layer 11. The well 1 is a semiconductor region where the upper surface of the epitaxial layer 11 is doped with p-type impurities (for example, aluminum (Al)). Furthermore, for example, a rear-surface electrode 14 that is made from a metal film is formed in a manner that is in contact with a rear surface of the SiC substrate 10. If the rear-surface electrode 14 is a conductive film that contains, for example, cold (Au), and if a semiconductor chip is a single device, the rear-surface electrode 14 is electrically connected to, for example, a drain electrode 5.

Formed on the upper surface of semiconductor substrate is an element separation insulating film 9 that surrounds the vicinity of the MOSFET. The element separation insulating film 9, for example, is made from, for example, a silicon oxide film. As indicated by the broken line in FIG. 1, the element separation insulating film 9 that expands along the upper surface of the semiconductor substrate has an opening portion in the shape of a rectangle when viewed from above. More precisely, a reference numeral 9 in FIG. 1 indicates a film that is formed outside a rectangular region which is surrounded by the broken line, not inside the rectangular region which is surrounded by the broken line. In a region inside the opening portion, more precisely, the active region, of the element separation insulating film 9, a source region 3 and a drain region 2, which are separated from each other, are formed on the upper surface of the semiconductor substrate. Each of the source region 3 and the drain region 2 is an $n^+$-type semiconductor region that is formed over a distance from an upper surface of the well 1 up to the middle of the depth of the well 1. The source region 3 and the drain region 2 are arranged side by side in an X direction along the upper surface of the semiconductor substrate. Each of the source region 3 and the drain region 2 is formed by doping the upper surface of the semiconductor substrate with n-type impurities (for example, nitrogen (N)).

It is noted that because a plug 7 is formed to reach the semiconductor substrate in a place from which the element separation insulating film 9 is removed, the element separation insulating film 9 is not actually formed right under the plug 7. That is, in a case where one portion of the opening portion in the element separation insulating film 9 and one portion of the plug 7 overlap when viewed from above, one portion of an outline of the opening portion is formed along an outline of the plug 7.

At this point, the opening portion in the element separation insulating film 9 overlaps only one portion of each of the source region 3 and the drain region 2, and the other portion of each of the source region 3 and the drain region 2 is covered with the element separation insulating film 9. Furthermore, each of the source region 3 and the drain region 2 is longer in length in the Y direction than the opening portion, and one portion of each of the source region 3 and the drain region 2 extends more outward than both ends of the opening portion in the Y direction. For this reason, the source region 3 and the drain region 2 face each other in a manner that interposes the well 1 between the source region 3 and the drain region 2, not only inside the active region, but also in a region other than the active region, more precisely, in a region that overlaps the element separation insulating film 9 when viewed from above. More precisely, the element separation insulating film 9 exposes one portion of the upper surface of the semiconductor substrate between the source region 3 and the drain region 2, through the opening portion. The Y direction is a direction along the upper surface of the semiconductor substrate and is a direction that intersects the X direction when viewed from above.

An element separation region (an element separation layer) 8 that is made from a p-type semiconductor region is formed on the upper surface of the semiconductor substrate, more precisely, on the upper surface of the well 1, in such a manner that surrounds each of the active region, the source region 3, and the drain region 2. An element separation region 8 is a semiconductor region where the upper surface of the epitaxial layer 11 is doped with p- type impurities (for example, aluminum (Al)). The element separation region 8 is formed, over the distance from the upper surface of the well 1 up to the middle of the depth of the well 1, inside the well 1. Each of the active region, the source region 3, and the drain region 2, and the element separation region 8 are separated from each other with the well 1 in between.

Formed on the semiconductor substrate in the active region is a gate insulating film 12 that is smaller in thickness than the element separation insulating film 9 and a gate electrode 4 on the gate insulating film 12. The gate insulating film 12 covers the element separation insulating film 9 that is an end portion of the opening portion and the upper surface of the semiconductor substrate in the active region. Within the active region, the gate electrode 4 is formed over a distance from a region right over the source region 3 up to a region right over the drain region 2. The gate electrode 4 extends in the Y direction. A gate leading-out interconnection (a gate interconnection) 16 that is integrally connected to one end portion in the Y direction, of the gate electrode 4 extends in the Y direction outside the active region, more precisely, on the element separation insulating film 9. The gate leading-out interconnection 16 extends from the active region side along each of the well 1 and the element separation region S.

The gate electrode 4 is a termination end right over the element separation insulating film 9, not within the active region, in the Y direction. More precisely, both end portions in the Y direction, of the gate electrode 4 is grounded on the element separation insulating film 9. The reason for this is as follows. The vicinity of an end portion of the gate electrode 4 is a region where it is easy for an electric field to converges, and when the gate insulating film, which is made from the gate electrode 4, a comparatively-thin silicon oxide film, and the like, is terminated with the active region, it is easy for dielectric breakdown to occur in the vicinity of the end portion of the gate electrode 4. More precisely, it is desirable that the end portion of the gate electrode 4 is terminated on the thick element separation insulating film 9. In this manner, the gate electrode 4 extends in such a manner as to straddle the opening portion in the element separation insulating film 9 in the Y direction, and, outside the opening portion, is connected to the gate leading-out interconnection 16 that extends on the element separation insulating film 9 in order to supply electric potential to the gate electrode 4.

Furthermore, the width of the gate electrode 4 is smaller than the width of each of the drain region 2 and the source region 3 in the Y direction (a gate width direction). Therefore, the drain region 2 and the source region 3 face each other on the side that lies more outward than the end portion of the gate electrode 4 in the Y direction.

Formed on the semiconductor substrate are the element separation insulating film 9, and an inter-layer insulating film 13 that covers the gate insulating film 12 and the gate electrode 4. The inter-layer insulating film 13 is made from, for example, the silicon oxide film, and an upper surface thereof is flattened. Formed on the inter-layer insulating film 13 are a plurality of through-holes (connection holes) that passes through inter-layer insulating film 13. The through-hole is formed right over each of the source region 3, the drain region 2 and the element separation region 8. Furthermore, the through-hole is also formed right over the gate leading-out interconnection 16 that is a destination of the extending gate leading-out interconnection 16, in a region that is not illustrated. The through-hole that reaches the upper surface of the semiconductor substrate also passes through the gate insulating film 12 and the element separation insulating film 9, in addition to the inter-layer insulating film 13.

The plug 7 is buried inside each connection hole. Furthermore, formed on the inter-layer insulating film 13 are the drain electrode 5 that is electrically connected to the drain region 2 via the plug 7 and a source electrode 6 that is electrically connected to the source region 3 via any other plug 7. The source electrode 6 is also electrically connected to the element separation region 8 via any other plug 7. More precisely, the source region 3 and the element separation region 8 are at the same electric potential (source electric potential). Furthermore, the well 1 that is connected to the source region 3 and the element separation region 8 is also at the source electric potential. Each of the plug, the drain electrode 5, and the source electrode 6 is made of, for example, aluminum (Al).

A principal feature of the present embodiment is that a length (a width) b1 of the gate leading-out interconnection 16 in the X direction is smaller than a length (a width) a1 in the gate length direction, of the gate electrode 4 that is formed along the source region 3 and the drain region 2 in the X direction and thus that the gate leading-out interconnection 16 is not formed over a distance between the source region 3 and the drain region 2. More precisely, at this point, in a region (a field region) that overlaps the element separation insulating film 9, the gate electrode 4 (the gate leading-out interconnection 16) is not formed over a distance from right over the source region 3 to right over the drain region 2. In other words, the gate electrode 4 overlaps each of the source region 3 and the drain region 2 when viewed from above, but the gate leading-out interconnection 16 is separated from the source region 3 when viewed from above.

Effects of the Present Embodiment

Figure 20:
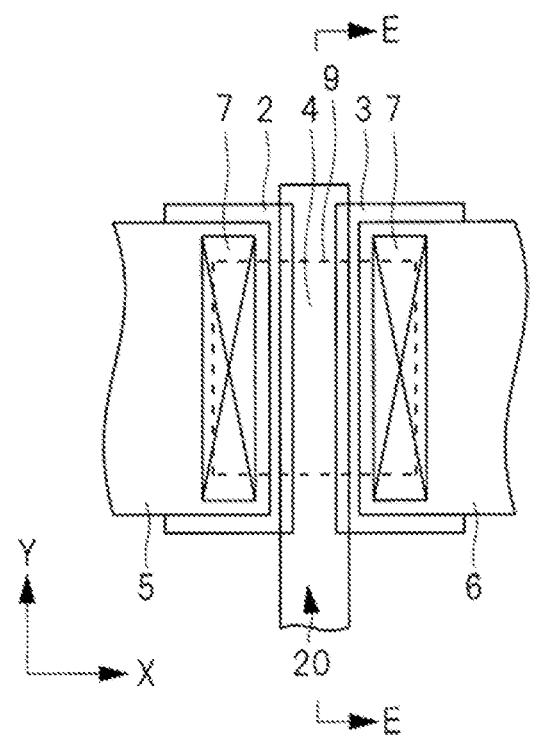
FIG. 20 is a plan-view diagram illustrating a semiconductor device according to a comparative example.
Figure 21:
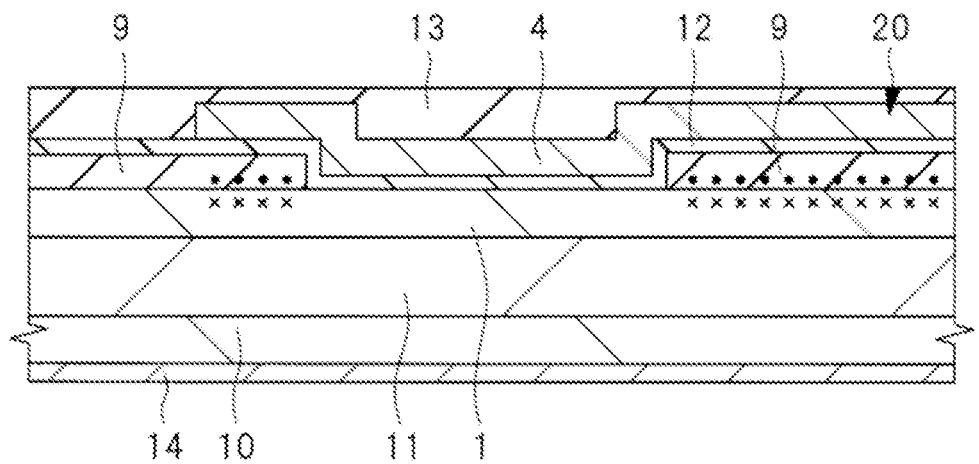
FIG. 21 is a cross-sectional diagram taken along line E-E in FIG. 20.

Effects of the present embodiment are described with reference to FIGS. 20 and 21. FIG. 20 is a plan-view diagram illustrating a semiconductor device in a comparative example. FIG. 21 is a cross-sectional diagram illustrating the semiconductor device in the comparative example. FIG. 21 is a cross-sectional diagram taken along line E-E in FIG. 20.

A structure of MOSFET in a comparative example in FIGS. 20 and 21 is different from that of the semiconductor device according to the present embodiment in that a gate leading-out interconnection 20 (the gate electrode 4) that extends in the Y direction is formed over the distance between the source region 3 and the drain region 2 in a region that overlaps the element separation insulating film 9 when viewed from above.

It is considered that in most of the semiconductor devices, a semiconductor element of which a material is silicon (Si) is employed. On the other hand, because a general-purpose Si device cannot find application in industrial products that are subject to exposure to a harsh environment such as a high-radiation field, in some cases, silicon carbide that is a material which has a large band gap is used.

There are principally three effects, a total dose effect, a displacement cascade damage effect, and a single event effect, which are due to an influence exerted by a radioactive ray. Particularly, an influence by a γ ray with a high energy level, which results in the total dose effect, causes a problem. The total dose effect refers to a phenomenon in which, when an absorbent material (for example, a semiconductor or an insulating film) is illuminated with energy that is higher than the band gap, an electron-hole pair occurs within the absorbent material and thus carriers that occur for this reason are accumulated within the absorbent material. The electron-hole pair that occurs within the semiconductor undergoes recombination while under a non-electric field, and undergoes diffusion or drifting and thus is ejected as current to the outside of a device while the electric effect takes place. For this reason, the carrier (an electron and a hole) that is induced does not stay behind within the semiconductor and thus an influence thereof can be almost disregarded.

On the other hand, an electron and a hole that are Generated within an insulating material such as an oxide film are influenced by an electric field in the film, and drifting toward the one that has low-potential energy takes place. The hole has lower mobility than the electron and has a high probability of being trapped hole trapping on a hole-trapping basis. Because of this, the holes are easy to accumulate in the insulating film. Because the trapped hole (trapped electric charge) forms positive electric charge, a space electric field that is generated as a result of this causes a threshold voltage of a transistor to be negative. In a case where a sufficient amount of positive electric charge is accumulated, an n channel-type transistor is a depression type device in which, although a voltage of 0 is input into a gate, current continues to flow, and an amount of leakage current increases.

Furthermore, an influence of the trapped electric charge is as follows. When the trapped electric charge is accumulated within the insulating film, a defect is induced at an interface between the insulating film and the semiconductor layer and thus problems occur such as a change in the threshold voltage and a decrease in the mobility of the carrier. When a defect density increases, an amount of off-leakage current that flows via the defect increases as well. Because of this, functional defects are caused to occur, such as a problem of a parameter defect such as the change in the threshold voltage and a problem of being unable to secure a signal-to-noise (SN) ratio.

Silicon carbide (SiC) is a compound semiconductor that is configured with silicon (Si) and carbon (C), and a band gap is approximately three times higher than that of Si. For this reason, regarding formation of an interface state on the semiconductor side, which is formed in the interface between the semiconductor and the insulating film, an increase in the amount of leakage current that flows via the interface state can be suppressed. However, in most cases, for the insulating film, a material that is the same as that of a Si device is used, and thus there is a concern that an increase in an amount of trapped electric charge that is entailed by an increase in integral dose will exert a bad influence on the leakage current.

In the semiconductor device in the comparative example that is illustrated in each of FIGS. 20 and 21, the gate electrode 4 has a structure in which the gate electrode 4 grounded on the element separation insulating film 9 that separates elements. In a case where the semiconductor device in the comparative example is illuminated with a γ ray, an electron-hole pair is generated in the insulating film that includes the element separation insulating film 9. Because the number of carriers that are generated increases depending on the thickness of the insulating film, more trapped electric charge is accumulated in the interface between the element separation insulating film 9 and the semiconductor substrate than within the gate insulating film 12 in the active region. This means that it is easy to induce an interface defect in the vicinity of the element, more precisely, a region where the element separation insulating film 9 is formed, and that it is easier for the leakage current to occur. In FIG. 21, the hole is indicated by a black circle and the interface defect is indicated by x.

The present inventors performed an experiment in which each insulating film that constitutes the MOSFET in the comparative example is illustrated with a 50 kGy γ ray under the condition that 3 MV/cm is applied from the outside. As a result, it was discovered that mutual conductance per 1 MV/cm increases to a three or more-digit indication due to the interface defect. Because the mutual conductance indicates the reciprocal of resistance, this indicates that, if field intensity is the same, the higher the mutual conductance, the larger the amount of current. More precisely, it is understood that, if the integral dose is sufficiently large, an amount of leakage current also increases in SiC.

When annealing processing is performed, at a temperature of 300° C., on a device of which a characteristic, as described above, is changed due to the radiation exposure, a mutual conductance characteristic overlaps a waveform prior to the illumination with the γ ray. This means that off-leakage is reduced due to an influence that results from removing the trapped electric charge in the insulating film, which induces the defect. That is, in order to obtain the high reliability over a long period of time under the environment of the illumination with the γ ray, it is also important that an amount of positive electric charge that is trapped in the insulating film is reduced. However, in some cases, the annealing processing is difficult to perform at a temperature of 300° C. on the device of which the characteristic is changed.

Accordingly, in the present embodiment, in a case where the interface defect that causes the leakage current occurs, the interface defect is set in such a manner as not to propagate throughput between the drain and the source. Thus, it is possible that the leakage current is prevented from occurring. That is, in the present embodiment, as illustrated in FIGS. 1 to 3, when, due to the radiation exposure, electric charge is accumulated in the element separation insulating film 9 between the gate electrode 4 and the semiconductor substrate, the leakage current due to the electric charge accumulation can be prevented from flowing between the source region 3 and the drain region 2 in the field region.

More precisely, in the semiconductor device that is illuminated with the radioactive ray (the γ ray), it is easy for positive electric charge to gather up within the thick element separation insulating film between the gate electrode and the semiconductor substrate (the well). For this reason, as in the comparative example that is illustrated in FIG. 20, in a case where, in the region (the field region) where the element separation insulating film 9 is formed, the gate electrode 4 (the gate leading-out interconnection 20) is formed over the distance between the source region 3 and the drain region 2, holes are accumulated within the element separation insulating film 9 right under the gate electrode 4 (the gate leading-out interconnection 20) and the interface defect occurs between the element separation insulating film 9 right under the gate electrode 4 and the semiconductor substrate. In the comparative example in which the gate electrode 4 is formed throughput between the source region 3 and the drain region 2 in the field region, because the interface defect is formed over the distance between the source region 3 and the drain region 2, a channel layer is formed that is a path along which the leakage current flows between the source region 3 and the drain region 2.

In contrast, in the present embodiment, the gate electrode 4 in the field region, more precisely, a length b1 in the X direction, of the element separation insulating film 9 right over the gate leading-out interconnection 16 is smaller than a length a1 in the X direction (the gate length direction), of the gate electrode 4 within the active region. In other words, in the region (the field region) that overlaps the element separation insulating film 9 when viewed from above, the gate electrode 4 (the gate leading-out interconnection 16) is not formed over the distance between the source region 3 and the drain region 2. More precisely, the gate leading-out interconnection 16, although set to be in contact with one of the source region 3 and the drain region 2, is separated from the other when viewed from above. In other words, the gate leading-out interconnection 16 is separated from one of the source region 3 and the drain region 2 when viewed from above. That is, the gate leading-out interconnection 16 that overlaps the element separation insulating film 9 when viewed from above, and that is integrally combined with the gate electrode 4 is formed in a region that is exposed from the gate electrode 4, in such a manner as not to extend over the distance between the drain region 2 and the source region 3 when viewed from above.

For this reason, although the holes are accumulated within the element separation insulating film 9 right under the gate electrode (the gate leading-out interconnection 16) due to the radiation exposure and thus the defect occurs in the interface between the element separation insulating film 9 and the semiconductor substrate, the interface defect is not formed over the distance between the source region 3 and the drain region 2. Consequently, because a leakage path is not formed between the source region 3 and the drain region 2, the leakage current (the off-leakage current) can be prevented from occurring. Furthermore, the problems can be prevented from occurring, such as the change in the threshold voltage and the decrease in the mobility of the carrier due to the occurrence of the interface defect, and the signal-to-noise (SN) ratio is also easy to secure. As described above, the reliability of the semiconductor device can be improved.

In the present embodiment, the case is described where a gate width of the gate electrode 4 that is illustrated in FIG. 1 is smaller than a width of each of the drain region 2 and the source region 3 and where the drain region 2 and the source region 3 face each other on the side that lies more outward than the end portion of the gate electrode 4 in the Y direction. In contrast, a gate width in the Y direction, of the gate electrode 4 may be greater than a width in the Y direction, of each of the drain region 2 and the source region 3. More precisely, when viewed from above, an end portion in the Y direction, of the gate electrode 4 may protrude on the side that lies more outward an end portion in the Y direction, of each of the drain region 2 and the source region 3. In this case, in the semiconductor device according to the present embodiment, the leakage path can be prevented from being formed between the drain region 2 and the source region 3 in such a manner as to go around the outside of the end portion in the Y direction, of the gate electrode 4 when viewed from above. More precisely, the leakage current can be prevented from occurring. However, a case where the gate width of the gate electrode 4, as illustrated in FIG. 1, is smaller than a width of each of the source region 3 and the drain region 2 in the Y direction has a stronger effect of suppressing the leakage current than this configuration.

It is noted that the semiconductor device according to the present first embodiment is different in plane layout from a semiconductor device according to a second embodiment, which will be described below, but can be manufactured in the same method as the semiconductor device according to the second embodiment. Consequently, a description of a method of manufacturing the semiconductor device according to the first embodiment is omitted.

Modification Example

Figure 4:
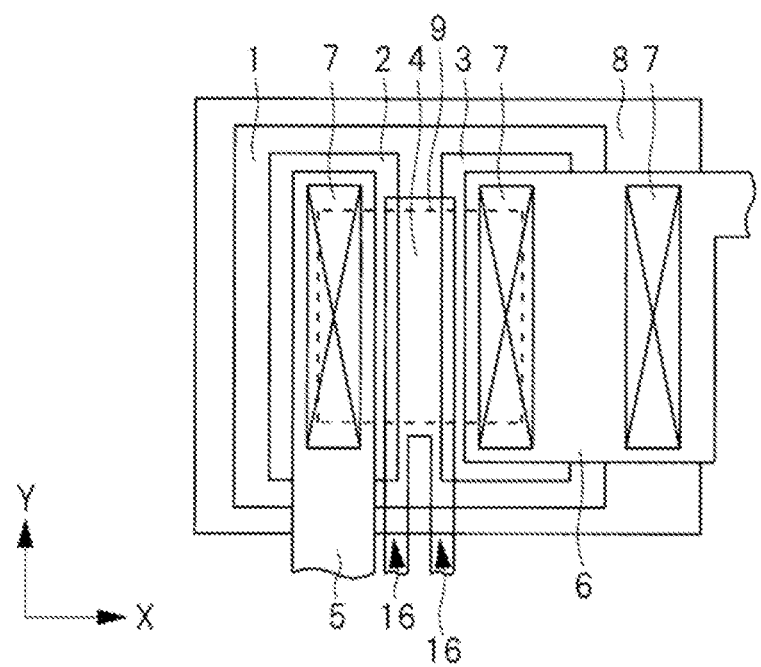
FIG. 4 is a plan-view diagram illustrating a semiconductor device according to a modification example of the first embodiment of the present invention.

FIG. 4 is a plan-view diagram of a modification example of the semiconductor device according to the present first embodiment. A structure that is illustrated in FIG. 4 is different from the structure that is illustrated in FIG. 1, in terms of a layout of the gate leading-out interconnection 16.

That is, the gate leading-out interconnections 16 may be two or more in number. At this point, one of the gate leading-out interconnections 16 overlaps the source region 3, and any other one of the gate leading-out interconnections 16 overlaps the drain region 2. However, these two gate leading-out interconnections 16 are separated from each other. At this point, each of the two gate leading-out interconnections 16 is also separated from one of the source region 3 and the drain region 2 when viewed from above. Consequently, it is difficult to accumulate holes in the vicinity of the element separation insulating film 9 right under a region between the two gate leading-out interconnections 16, and it is difficult for the interference defect to occur. For this reason, the same effect as in the structure that is described with reference to FIGS. 1 to 3 can be obtained.

Second Embodiment

Figure 5:
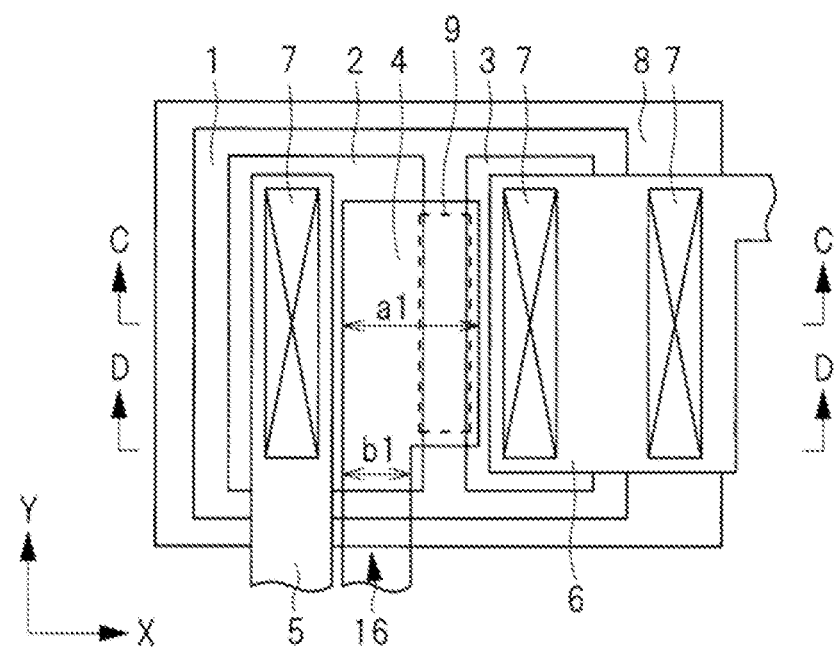
FIG. 5 is a plan-view diagram illustrating a semiconductor device according to a second embodiment of the present invention.
Figure 6:
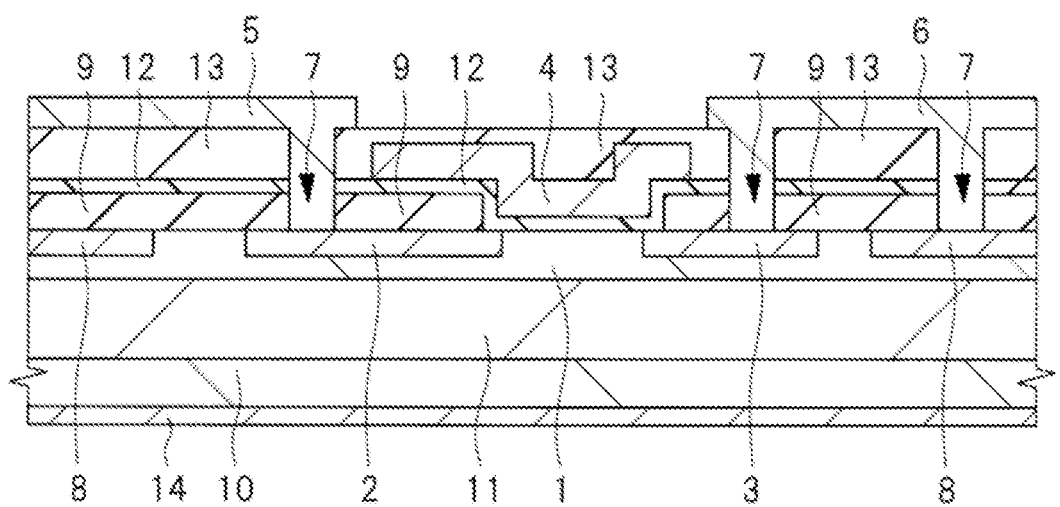
FIG. 6 is a cross-sectional diagram taken along line C-C in FIG. 5.
Figure 7:
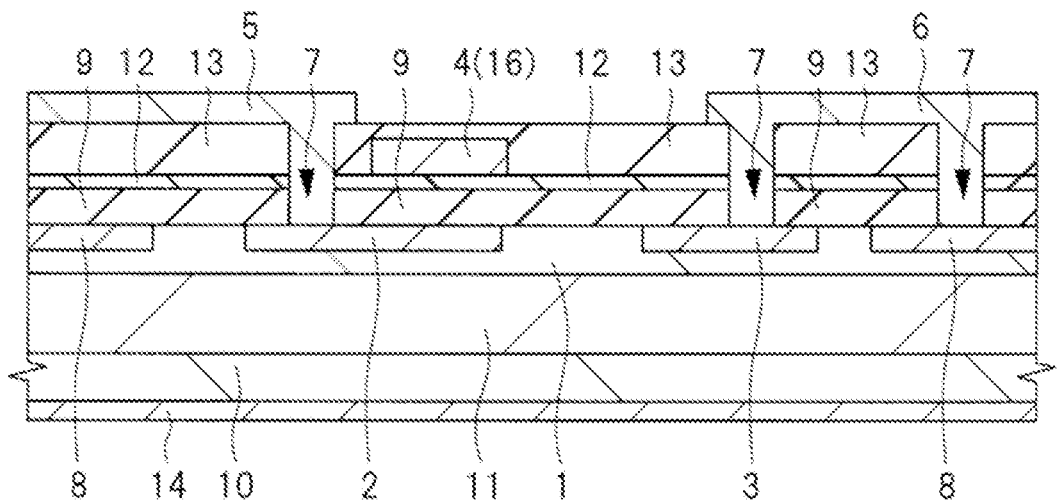
FIG. 7 is a cross-sectional diagram taken along line D-D in FIG. 5.

Next, a semiconductor device according to the present second embodiment will be described with reference to FIGS. 5 to 7. FIG. 5 is a plan-view diagram of the semiconductor device according to the second embodiment of the present invention. FIGS. 6 and 7 each illustrate a cross-sectional diagram of the semiconductor device according to the present embodiment. FIG. 6 is a cross-sectional diagram cut along line C-C in FIG. 5. FIG. 7 is a cross-sectional diagram cut along line D-D in FIG. 5.

As illustrated in FIGS. 5 to 7, the semiconductor device according to the present embodiment is different from that according to the first embodiment in that the width in the X direction, of each of the drain region 2, the gate electrode 4, and the gate leading-out interconnection 16 is greater. Furthermore, at this point, the difference with the first embodiment is that, when viewed from above, a width in the X direction, of a portion where the drain region 2 and the gate electrode 4 overlap is greater than a width in the X direction, of a portion where the source region 3 and the gate electrode 4 overlap and that the gate leading-out interconnection 16 does not overlap a region between the drain region 2 and the source region 3 faces each other, when viewed from above. Furthermore, a difference with the first embodiment is that a width in the X direction, of the opening portion in the element separation insulating film 9 is small and that, in the X direction, both ends of the gate electrode 4 is also grounded on the element separation insulating film 9.

In the present embodiment, without overlapping the region between the source region 3 and the drain region 2, the gate leading-out interconnection 16 can be positioned in the transverse direction of the region. Because of this, even in a case where a distance between the source region 3 and the drain region 2 is short, the gate leading-out interconnection 16 can be reasonably formed to have a width that is equal to or greater than a minimum processing dimension. More precisely, in a case where a length a1 of the gate electrode 4 is temporarily the minimum processing dimension, as in the first embodiment, when the gate leading-out interconnection 16 that is thinner than the gate electrode 4 is set to extend from the end portion in the Y direction, of the gate electrode 4, the gate leading-out interconnection 16 of which the length b1 is smaller than the minimum processing dimension is formed. Because of this, the semiconductor device is difficult to manufacture.

In contrast, at this point, the length a1 of the gate electrode 4 is expanded. For this reason, even in a case where the width in the X direction, of the opening portion in the element separation insulating film 9 is the minimum processing dimension, there is no need to form the gate leading-out interconnection 16 that has the minimum processing dimension. Consequently, because the length b1 of the gate leading-out interconnection 16 can be increased, an improvement in yield that is entailed by relaxing of a processing condition is possible. Furthermore, because the gate leading-out interconnection 16 can be formed in a comparatively thick manner, resistance of the gate leading-out interconnection 16 can be reduced.

Furthermore, as illustrated in FIG. 6, the gate electrode 4 is configured to be grounded extensively on the element separation insulating film 9 on the drain region 2. A distance between the connection hole on the drain region 2 and the connection hole on the source region 3 increases as much as the gate electrode 4 is grounded. Consequently, as illustrated in FIG. 7, the gate leading-out interconnection 16 that leads out of the gate electrode 4 can be caused to leads from over the drain region 2. Therefore, the gate electrode 4 (the gate leading-out interconnection 16) is not provided right over the region between the drain region 2 and the source region 3. In other words, the gate leading-out interconnection 16 is separated from the region between the drain region 2 and the source region 3, when viewed from above. For this reason, the interface defect can be prevented from occurring between the source and the drain under the element separation insulating film 9, and the amount of leakage current can be much more reduced than in the first embodiment.

Next, a method of manufacturing the semiconductor device according to the present embodiment will be described with reference to FIGS. 8 to 14. FIGS. 8 to 14 are cross-sectional diagrams of the semiconductor device according to the present embodiment. FIGS. 8 to 14 are cross sections, each illustrating the same position in FIG. 6.

Figure 8:
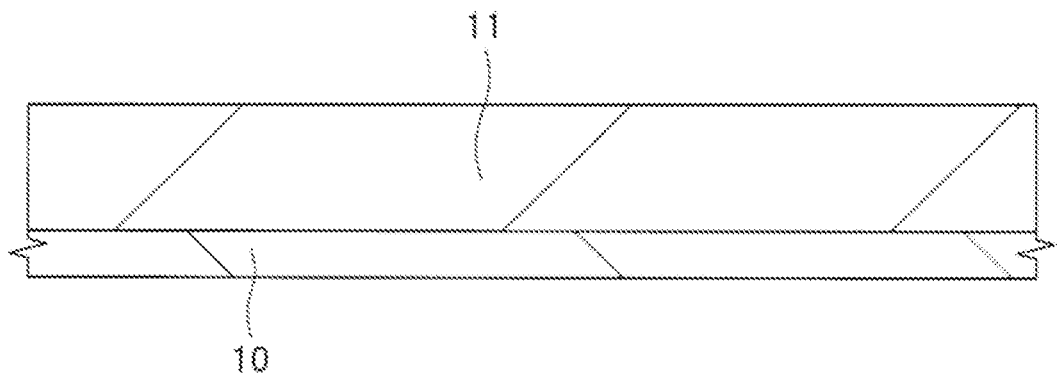
FIG. 8 is a cross-sectional diagram of the semiconductor device according to the second embodiment of the present invention, manufacturing processes of which are in progress.

First, as illustrated in FIG. 8, an n-type SiC substrate (a semiconductor substrate) 10 that has an upper surface and a rear surface that is opposite ink direction to the upper surface is prepared. The SiC substrate 10 is made of silicon carbide (SiC). Subsequently, an n-type epitaxial layer 11 that is made of SiC is formed on the upper surface of the SiC substrate 10 using an epitaxial growth method. At this point, the epitaxial layer 11 is grown while the epitaxial layer 11 is doped with n-type impurities (for example, nitrogen (N)), and thus it is possible that the epitaxial layer 11 is formed at a desired concentration of impurities.

Figure 9:
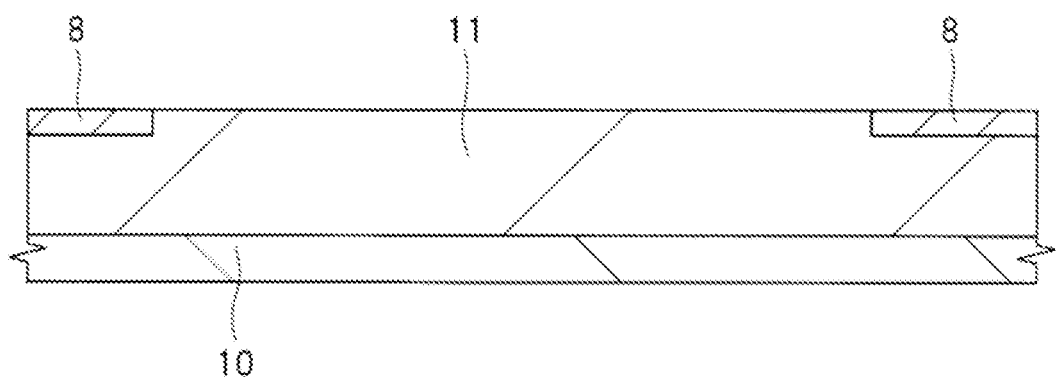
FIG. 9 is a cross-sectional diagram of the semiconductor device, manufacturing processes of which are in progress subsequently to those in FIG. 8.

Next, as illustrated in FIG. 9, p-type impurities (for example, aluminum (Al)) are implanted into the upper surface of the epitaxial layer 11 using a photography technology and an ion implantation technique. Accordingly, the element separation region 8 that is the p-type semiconductor region is formed on the upper surface of the epitaxial layer 11. The element separation region 8 is formed in an isolation region, over a distance from the upper surface of the epitaxial layer 11 to the middle of the depth of the epitaxial layer 11. More precisely, the element separation region 8 is formed in such a manner as to surround a region where a MOSFET will be formed later, when viewed from above.

Figure 10:
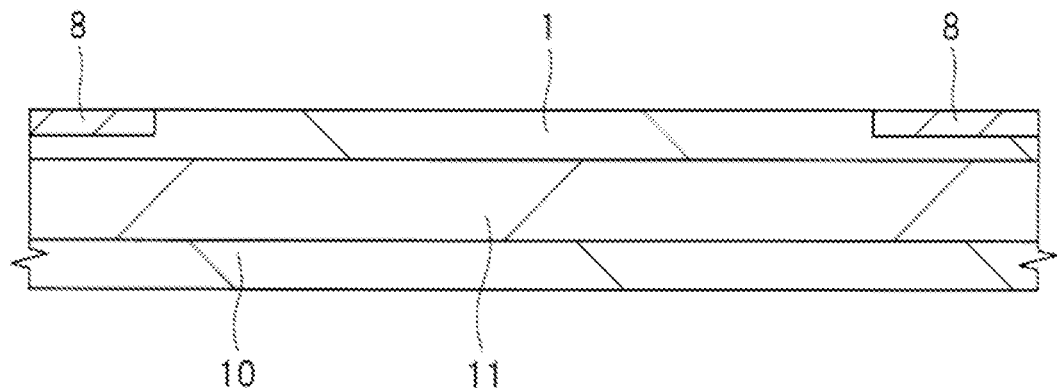
FIG. 10 is a cross-sectional diagram of the semiconductor device, manufacturing processes of which are in progress subsequently to those in FIG. 9.

Next, as illustrated in FIG. 10, p-type impurities (for example, aluminum (Al)) are implanted into the upper surface of the epitaxial layer 11 using the photography technology and the ion implantation technique. Accordingly, the well 1 that is the p-type semiconductor region (a p-type diffusion layer) is formed on the upper surface of the epitaxial layer 11. The well 1 has a lower concentration of p-type impurities and a smaller formation depth than the element separation region 8. However, a lower surface of the well 1 does not reach an interface between the epitaxial layer 11 and the SiC substrate 10. The element separation region 8 is positioned on the upper surface of the well 1, and has the shape of a ring when viewed from above.

Figure 11:
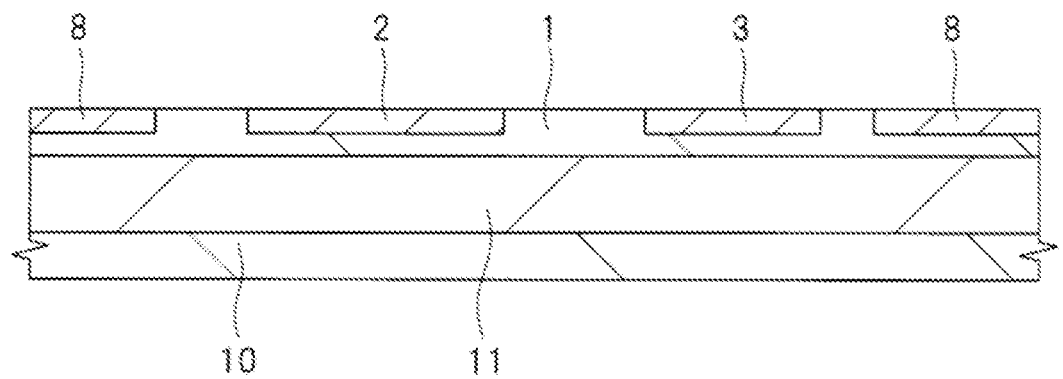
FIG. 11 is a cross-sectional diagram of the semiconductor device, manufacturing processes of which are in progress subsequently to those in FIG. 10.

Next, as illustrated in FIG. 11, n-type impurities (for example, nitrogen (N)) are implanted at a high concentration into the upper surface of the epitaxial layer 11 using photography technology and the ion implantation technique. Accordingly, the source region 3 that is the $n^+$-type semiconductor region and the drain region 2 that is the $n^+$-type semiconductor region are formed on the upper surface of the epitaxial layer 11. A formation depth of each of the source region 3 and the drain region 2 is smaller than the depth of the well 1. The source region 3 and the drain region 2 are formed in positions, respectively, on the upper surface of the well 1, which are surrounded by the element separation region 8 when viewed from above.

Figure 12:
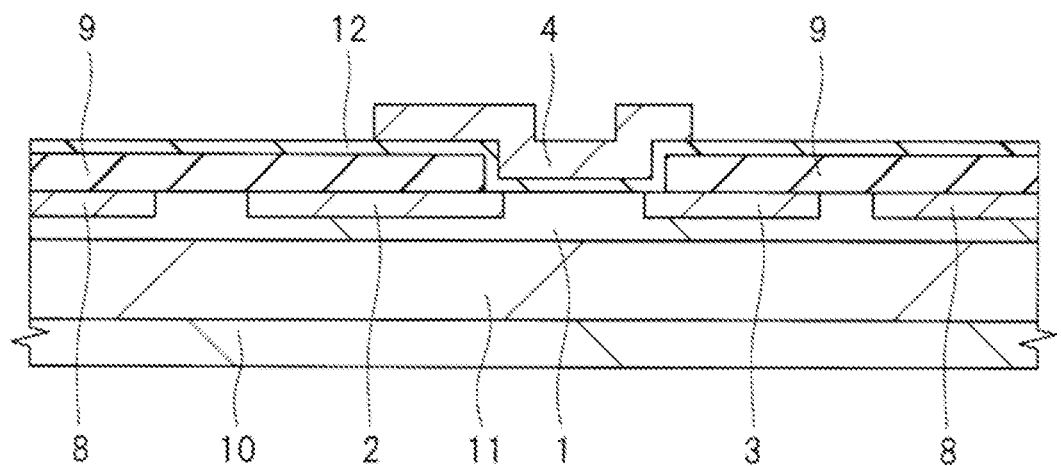
FIG. 12 is a cross-sectional diagram of the semiconductor device, manufacturing processes of which are in progress subsequently to those in FIG. 11.

Next, as illustrated in FIG. 12, a comparatively thick insulating film is formed on the epitaxial layer 11, using, for example, a chemical vapor deposition (CVD) technique. This insulating film is made of, for example, silicon oxide. Thereafter, the insulating layer is processed (patterned) using the photography technology and an etching technique, and thus the upper surface of the epitaxial layer 11 is exposed and the element separation insulating film 9 is made from the insulating film is formed. At this point, an opening portion that exposes the region between the source region 3 and the drain region 2 that face each other is formed in the element separation insulating film 9.

Subsequently, the gate insulating film 12 that has a smaller film thickness than the element separation insulating film 9, and a conductive film in this order are formed on the epitaxial layer 11, using, for example, the CVD technique. The gate insulating film 12 is made from, for example, the silicon oxide film, and the conductive film is made of, for example, polysilicon, aluminum (Al), tungsten (W), or the like. Subsequently, the conductive film is processed (patterned) using the photography technology and the etching technique, and thus an upper surface of one portion of the gate insulating film 12 is exposed and the gate electrode 4 and the gate leading-out interconnection 16 (refer to FIG. 5), which are made from the conductive film, are formed. That is, the gate electrode 4 is formed right over the upper surface of the epitaxial layer 11 (the well 1) between the source region 3 and the drain region 2, with the gate insulating film 12 in between.

Figure 13:
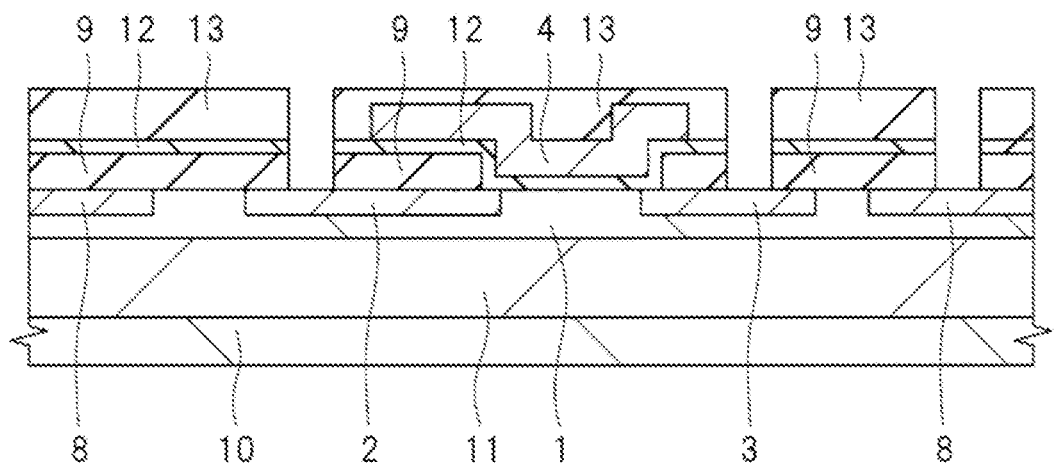
FIG. 13 is a cross-sectional diagram of the semiconductor device, manufacturing processes of which are in progress subsequently to those in FIG. 12.

Next, as illustrated in FIG. 13, the inter-layer insulating film 13 is formed on the epitaxial layer 11, using, for example, the CVD technique. The inter-layer insulating film 13 is made from, for example, the silicon oxide film. At this point, with the inter-layer insulating film 13, a flank surface and upper surface of the gate electrode 4 are covered, and an upper surface of each of the gate insulating film and the element separation insulating film 9 is covered. Subsequently, the inter-layer insulating film 13 is processed using the photography technology and the etching technique, and thus the inter-layer insulating film 13, the gate insulating film 12, and the element separation insulating film 9 are pierced and a plurality of connection holes through which the upper surface of the epitaxial layer 11 is exposed are formed. On a bottom portion of each connection hole, the source region 3, the drain region 2, or the element separation region 8 is exposed through a multi-layered film that is made from the inter-layer insulating film 13, the gate insulating film 12, and the element separation insulating film 9.

Figure 14:
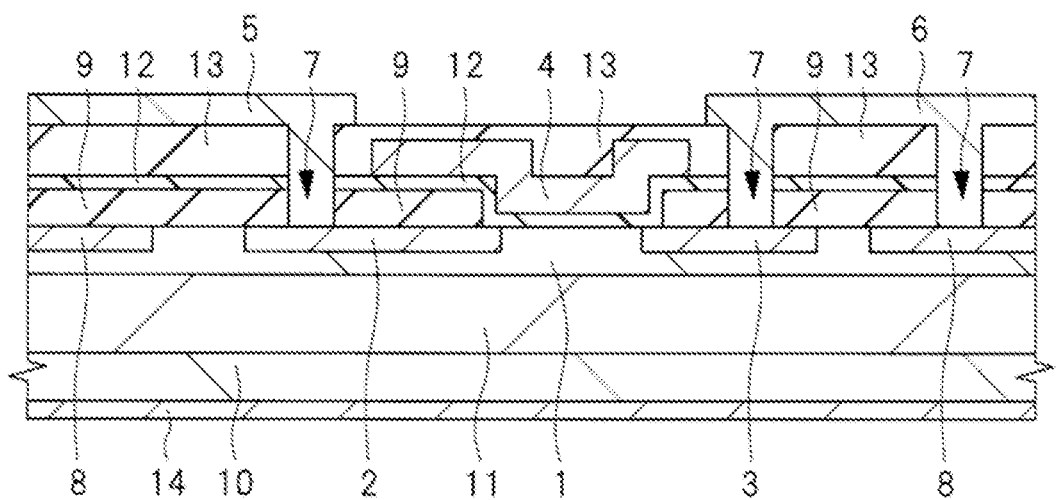
FIG. 14 is a cross-sectional diagram of the semiconductor device, manufacturing processes of which are in progress subsequently to those in FIG. 13.

Next, as illustrated in FIG. 14, a metal film is formed on the epitaxial layer 11 and inter-layer insulating film 13, in which the connection hole is formed, using, for example, a sputtering technique. The metal film is made of, for example, aluminum (Al), and fills up each of the plurality of connection holes. Subsequently, the metal film on the inter-layer insulating film 13 is processed using the photography technology and the etching technique, and thus one portion of an upper surface of the inter-layer insulating film 13 is exposed. With this processing process, the metal film is separated, and the source electrode 6 and the drain electrode 5 are made from the metal film. The source electrode 6 is electrically connected to the source region 3, and the drain electrode 5 is electrically connected to the drain region 2.

Subsequently, the rear-surface electrode 14 that covers the rear surface of the SiC substrate 10 is formed, using, for example, the sputtering technique. The rear-surface electrode 14 is a conductive film that contains, for example, gold (Au), and, for example, in the case of a single device, is electrically connected to the drain electrode 5.

With the process described above, the n channel-type MOSFET that includes the gate electrode 4, the source region 3, and the drain region 2 can be formed as the semiconductor device according to the present embodiment. In the MOSFET that is formed in this manner, the same effect as in the semiconductor device that is described with reference to FIGS. 5 to 7 can be obtained. Furthermore, when compared with the process of manufacturing the semiconductor device in the comparative example, which is illustrated in each of FIGS. 20 and 21, in the process of forming the semiconductor device according to the present embodiment, a new process does not need to be added, and the effect described above can be obtained only by changing a layout of an element. More precisely, complexity in the process of manufacturing the semiconductor device and an increase in the cost of manufacturing the semiconductor device can be avoided.

At this point, the positioning of the gate leading-out interconnection 16 from the gate electrode 4 in such a manner as to pass over the drain region 2 is described, but the gate leading-out interconnection 16 may be positioned in such a manner as to pass over the source region 3.

Third Embodiment

Figure 15:
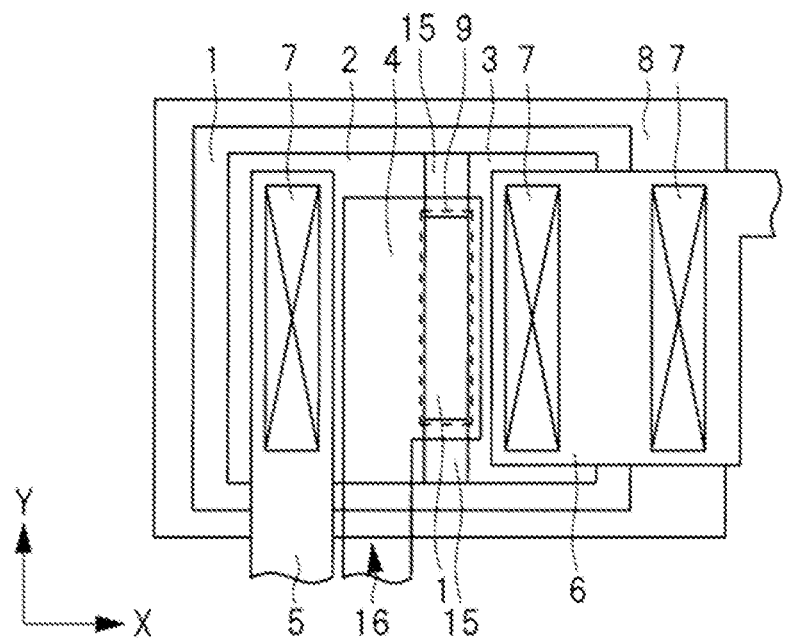
FIG. 15 is a plan-view diagram illustrating a semiconductor device according to a third embodiment of the present invention.

FIG. 15 is a plan-view diagram of a semiconductor device according to a third embodiment.

The semiconductor device according to the present embodiment is different from that according to the second embodiment in that a high-concentration layer 15, which is a p-type semiconductor region that has a higher concentration of impurities than the well 1, is formed between the drain region 2 and the source region 3 under the element separation insulating film 9, in the vicinity of each of the both ends of the gate electrode 4 in the gate width direction. That is, the high-concentration layer 15 that is a region that is doped with p-type of impurities (for example aluminum (Al)) is formed in a region that is the upper surface of the well 1 between the drain region 2 and the source region 3 and is covered with the element separation insulating film 9.

Each of two high-concentration layers 15 overlaps the end portion of the gate electrode 4 in the gate width direction (the Y direction) when viewed from above. Furthermore, an end portion on the gate insulating layer 4 side, which is an end portion in the Y direction, of the high-concentration layer 15, overlaps the active region within the opening portion in the element separation insulating film 9, when viewed from above. The high-concentration layer 15 is electrically connected to the element separation region 8 with the well 1 in between, and because of this, has the same electric potential as the source region 3 and the element separation region 8. More precisely, the high-concentration layer 15 is electrically connected to the source region 3.

With the configuration described above, a channel layer can be suppressed from being formed on a principal surface of the well 1, although trapped electric charge is accumulated on an end portion in the gate width direction, of the gate electrode 4 in which it is for an electric field to converge. For this reason, the leakage current can be further suppressed from occurring, compared with the second embodiment.

Fourth Embodiment

Figure 16:
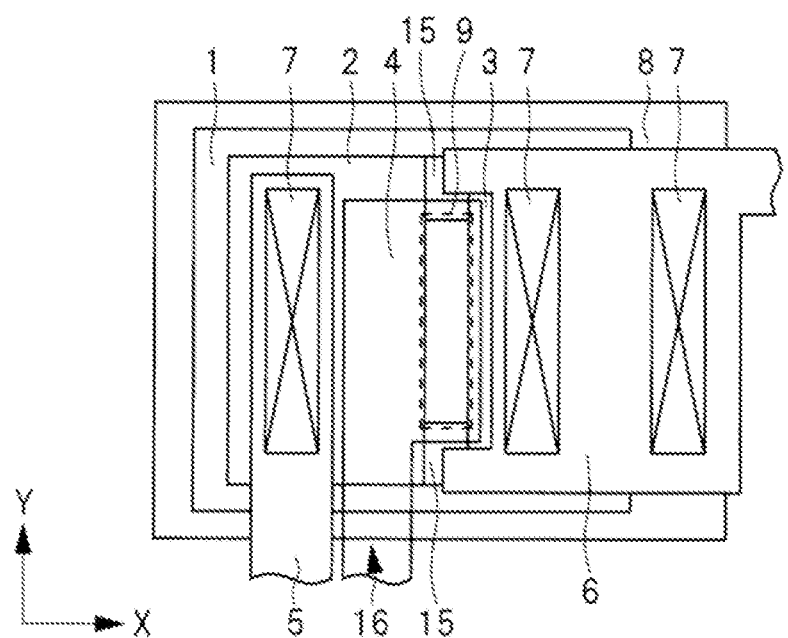
FIG. 16 is a plan-view diagram illustrating a semiconductor device according to a fourth embodiment of the present invention.

FIG. 16 is a plan-view diagram of a semiconductor device according to a fourth embodiment.

The semiconductor device according to the present embodiment is different from that according to the third embodiment in that one portion of the source electrode 6 that is electrically connected to the source region 3 overlaps the high-concentration layer 15 when viewed from above. With this configuration, the trapped electric charge can be reduced that is accumulated on the element separation insulating film 9 due to the electric field that leaks from the end portion of the gate electrode 4 in which it is easy for the electric field to converge. For this reason, the amount of leakage current can be further reduced compared with the third embodiment.

Figure 22:
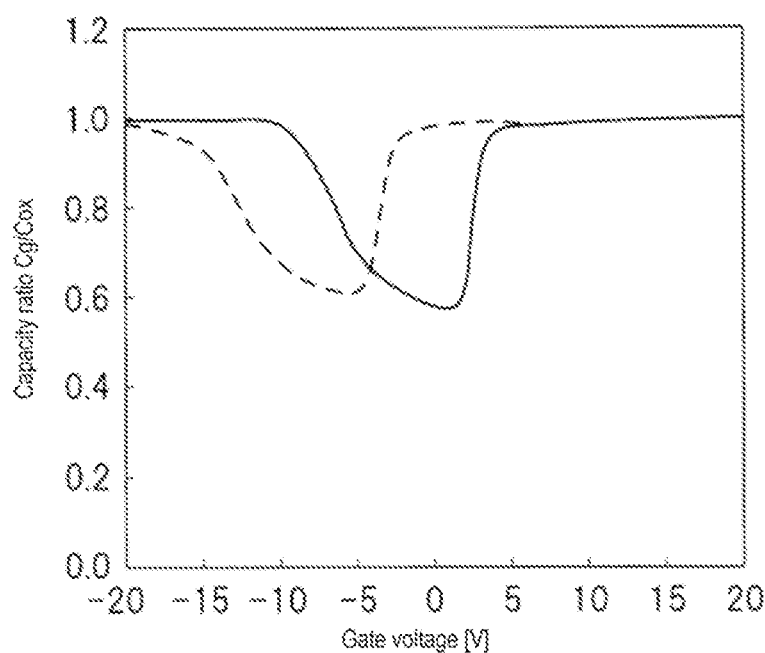
FIG. 22 is a graph illustrating a change in a relationship between a gate voltage and a capacity ratio between a gate and an oxide film.

At this point, FIG. 22 illustrates a change in a relationship between a gate voltage and a capacity ratio between a gate and an oxide film using a graph. The graph in FIG. 22 illustrates a result of an experiment that was performed by the present inventors, and illustrates a CVg characteristic (a flat band voltage characteristic) of a SiC device that is illuminated with a γ ray under the condition that 3 MV/cm is applied to the insulating film which constitutes the semiconductor device. The graph that is indicated by a solid line in FIG. 22 illustrates a flat band voltage characteristic before the illumination with the γ ray and the graph that is indicated by a broken line illustrates a flat band voltage characteristic after the illumination with the γ ray. A gate capacity Cg along the vertical axis in FIG. 22 is a capacity of the gate electrode, and an oxide film capacity Cox along the vertical axis is a capacity of the insulating film.

As illustrated in FIG. 22, a flat band voltage after the illumination with a ray of 100 kGy is shifted to the negative 6.5 V side compared with the pre-illumination. This illustrates that the electron-hole pair that is excited a radioactive ray in the insulating film is separated by the electric field in the insulating film, and that the hole is trapped at the interference surface between the insulating film and the semiconductor layer.

Figure 23:
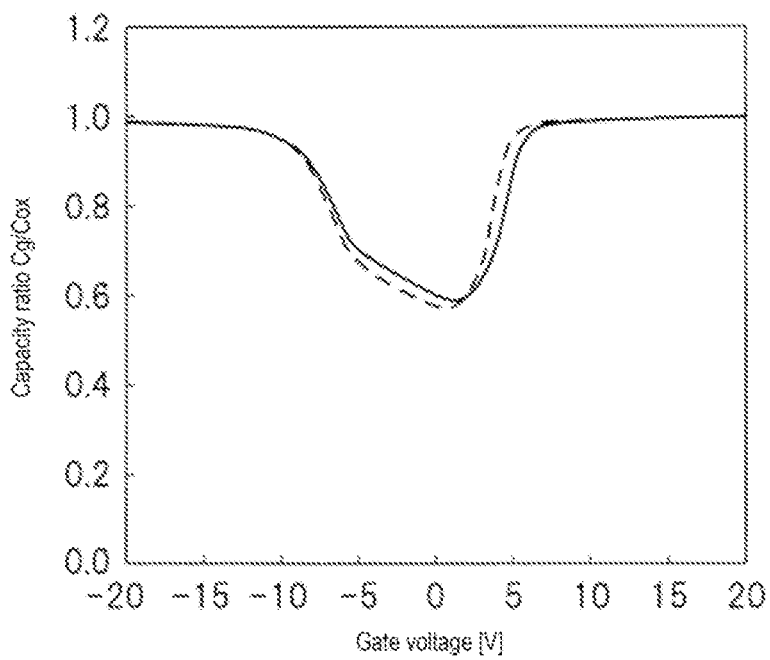
FIG. 23 is a graph illustrating a change in a relationship between a gate voltage and a capacity ratio between a gate and an oxide film.

Furthermore, FIG. 23 illustrates a change in a relationship between a gate voltage and a capacity ratio between a gate and an oxide film using a graph. FIG. 23 illustrates a result of an experiment that was performed by the present inventors, and illustrates a CVg characteristic of a SiC device that is illuminated with a γ ray without applying an electric field to the insulating film which constitutes the semiconductor device. The graph that is indicated by a solid line in FIG. 23 illustrates a flat band voltage characteristic before the illumination with the γ ray and the graph that is indicated by a broken line illustrates a flat band voltage characteristic after the illumination with the γ ray. A gate capacity Cg along the vertical axis in FIG. 23 is a capacity of the gate electrode, and an oxide film capacity Cox along the vertical axis is a capacity of the insulating film.

As illustrated in FIG. 23, a CV waveform of an element that is illuminated with a γ ray of 100 kGy is almost the same as that before the illumination, it was not checked that the trapped electric charge was accumulated in the insulating film. This is because in a case where the electric carrier is not applied to the insulating film, the carrier that is excited by the radioactive ray can be shifted and a recombination probability increases. For reason, the hole in the insulating is difficult to shift at the interface between the insulating film and the semiconductor layer, and the flat band voltage is not almost changed.

From the two graphs that are illustrated above, it is understood that, if the electric field is not applied to the insulating film, although the insulating film is illuminated with the radioactive ray, the positive electric charge is difficult to accumulate.

As illustrated in FIG. 16, the high-concentration layer 15 according to the present embodiment is electrically connected to the source electrode 6 with the well 1 and the element separation region 8 in between, and the electric field is not almost applied to the insulating film that is interposed between the high-concentration layer 15 and the source electrode 6. For this reason, although the electric field leaks from the gate electrode 4 into the element separation insulating film 9 and the inter-layer insulating film 13 (refer to FIG. 6), it is difficult for the interface defect to occur in a region that is interposed between the high-concentration layer 15 and the source electrode 6 which overlap each other when viewed from above. Because of this, the leakage current can be suppressed. More precisely, the insulating film (for example, the element separation insulating film 9) on the high-concentration layer 15 between the source region 3 and the drain region 2 is interposed between the high-concentration layer 15 and the source electrode 6 that have the same electric potential, and thus the interface defect, which is the leakage path between the source region 3 and the drain region 2, can be prevented from occurring. Consequently, the leakage current can be prevented from occurring compared with the third embodiment.

First Modification Example

Figure 17:
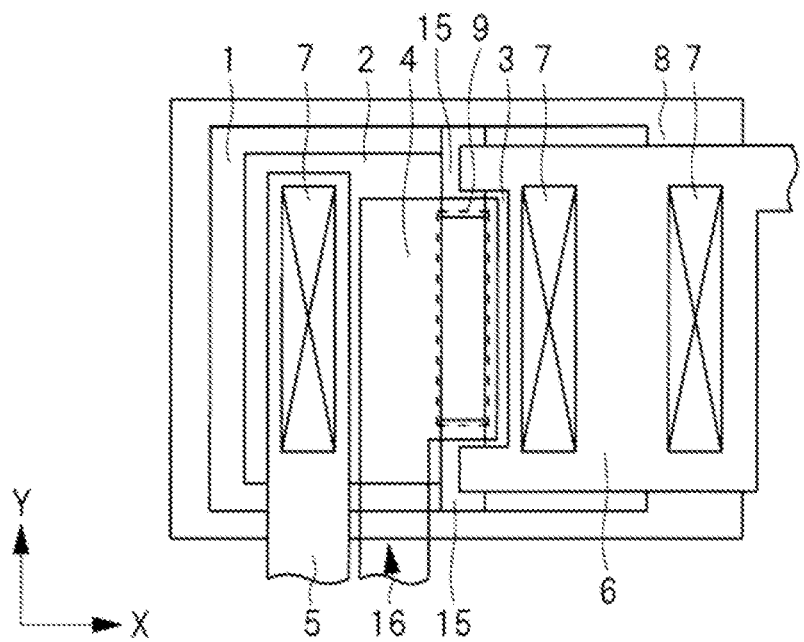
FIG. 17 is a plan-view diagram illustrating a semiconductor device according to a first modification example of the fourth embodiment of the present invention.

FIG. 17 is a plan-view diagram of a semiconductor device according to a first modification example of the present fourth embodiment. As illustrated in FIG. 17, the high-concentration layer 15 maybe in contact with the element separation region 8. Accordingly, the high-concentration layer 15 is electrically connected to the element separation region 8, in a manner that has a low resistance. With this configuration, the electric field to the insulating film (for example, the element separation insulating film 9) that is provided between the high-concentration layer 15 and the source electrode 6 is weaker. Because of this, the accumulation of the trapped electric charge can be reduced compared with the structure that is illustrated in FIG. 16.

Second Modification Example

Figure 18:
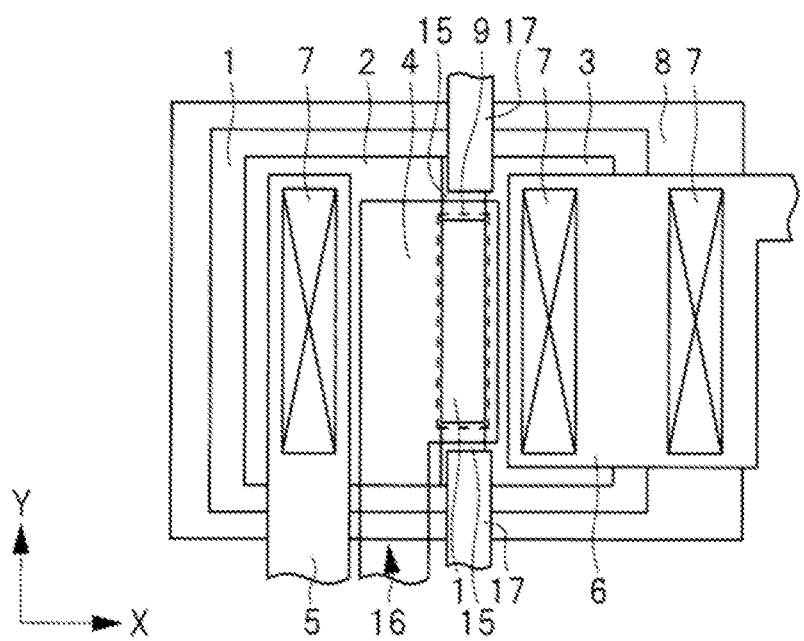
FIG. 18 is a plan-view diagram illustrating a semiconductor device according to a second modification example of the fourth embodiment of the present invention.

FIG. 18 is a plan-view diagram of a semiconductor device according to a second modification example of the fourth embodiment. As illustrated in FIG. 18, an electrode that overlaps the high-concentration layer 15 when viewed from above, and that has the same electric potential as the high-concentration layer 15 may not be the source electrode 6. An electrode 17 that is separated from the source electrode 6 and the drain electrode 5 and is separated from the source electrode 6 and the drain electrode 5 is formed in a manner that overlap the high-concentration layer 15 when viewed from above. The electrode 17 is made from a metal pattern that can be formed in the same process as the source electrode 6 and the drain electrode 5, and is formed at the same height as the source electrode 6 and the drain electrode 5.

The same electric potential as is applied to the high-concentration layer 15 is applied to the electrode 17. For example, in a case where the source electric potential, more precisely, a voltage of 0 V is applied to the high-concentration layer 15, the voltage of 0 V is also applied to the electrode 17. In this manner, in order to cause the electric field to the insulating film on the high-concentration layer 15 to be weak, the electrode 17 that is positioned in a manner that overlaps the high-concentration layer 15 when viewed from above may be an electrode that is different from the source electrode 6. Accordingly, the same effect as in the semiconductor device that is described with reference to FIG. 16 can be obtained.

Fifth Embodiment

Figure 19:
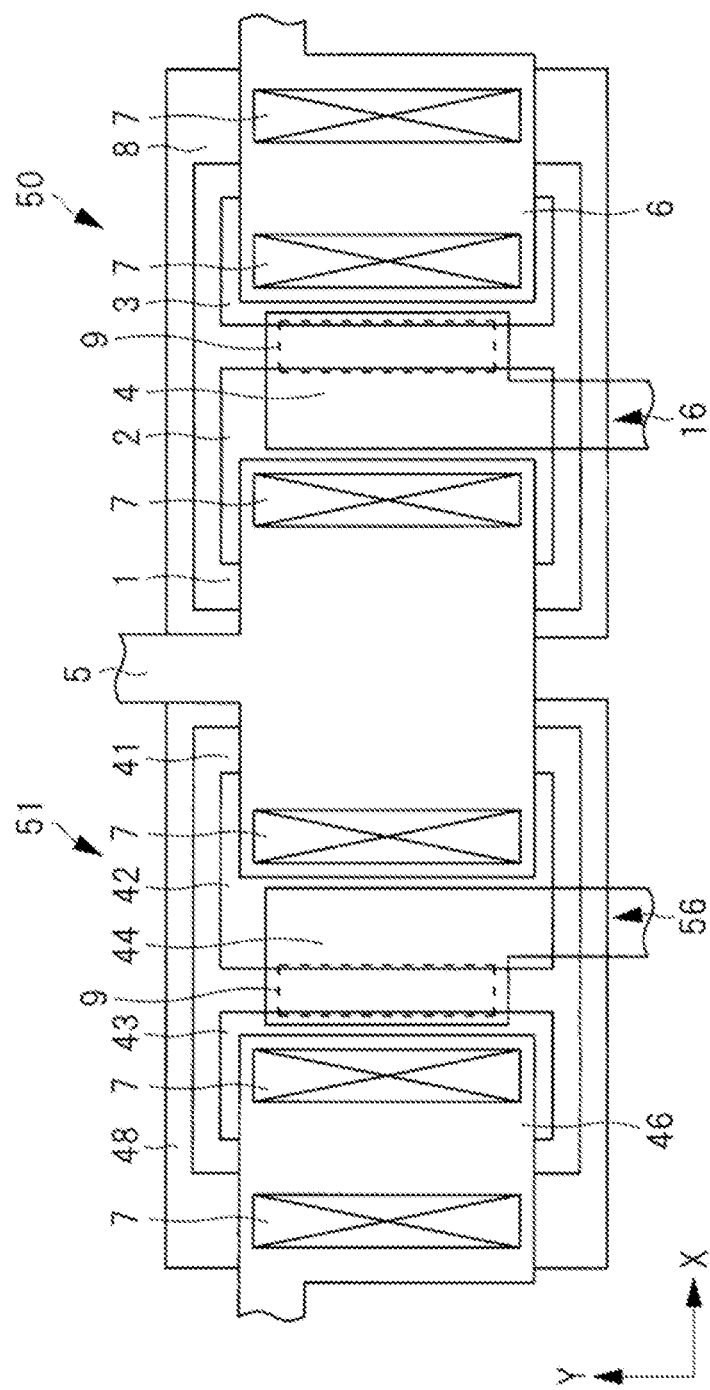
FIG. 19 is a plan-view diagram illustrating a semiconductor device according to a fifth embodiment of the present invention.

FIG. 19 is a plan-view diagram of a semiconductor device according to a fifth embodiment. As illustrated in FIG. 19, the invention in the present application may find application in each of the plurality of transistors that are provided adjacent to each other a principal surface of a semiconductor substrate. The plurality of transistors includes an n channel-type transistor 50 and a p channel-type transistor 51, and together constitute one integrated circuit.

The n channel-type transistor 50 has the same structure as the MOSFET according to the second embodiment. However, the drain electrode 5 extends toward the p channel-type transistor 51. The p channel-type transistor 51 has a layout in which the p channel-type transistor 51 and the n channel-type transistor 50 are linearly symmetrical about a line that overlaps the drain electrode 5. That is, the p channel-type transistor 51 has an n-type well 41 that is formed on an upper surface of a semiconductor substrate, as a channel layer, and a source region 43 and a drain region 42 that are a p-type semiconductor region are formed on an upper surface of the well 41. An element separation region 48 that is an n-type semiconductor region is formed on the upper surface of the well 41 in such a manner as to surround the well 41, the source region 43, and the drain region 42, and the element separation insulating film 9 that has an opening portion is formed on the well 41. The gate electrode 44 is formed on the well 41 with a gate insulating film (not illustrated) in between in such a manner as to cover the opening portion. The drain region 42 is connected to the drain electrode 5 with the plug 7 in between, and the source region 43 is connected to a source electrode 46 with the plug 7 in between. The p channel-type transistor 51 is configured with the gate electrode 44, the source regions 43, and the drain region 42.

A gate leading-out interconnection 56 that leads out of the gate electrode 44 may extend in the Y direction, passing above the drain region 42, and is not formed right over a region between the drain region 42 and the source region 43. For this reason, the same effect as in the second embodiment can be obtained in each of the n channel-type transistor 50 and the p channel-type transistor 51. That is, it is possible that an integrated circuit that has an excellent radiation resistance.

The embodiments of the invention that was made by the inventors are described in detail above, but the present invention is not limited to the embodiments. Various modifications are possible within the scope that does not depart from the gist of the invention.

For example, each of the embodiments and the modification examples, which are described above, may be combined with each other.

What is claimed is:

1. A semiconductor device comprising:
   a semiconductor substrate;
   a source region and a drain region that are formed on an upper surface of the semiconductor substrate and are adjacent to each other in a first direction;
   an element separation insulating film that is formed on the semiconductor substrate and exposes a portion of a first region which is the upper surface of the semiconductor substrate between both the source region and the drain region;
   a gate electrode that is formed on a region over the first region, a portion of the drain region and a portion of the source region;
   a gate insulating film thinner than the element separation insulating film and the gate electrode;
   a gate leading-out interconnection that is integrally connected to the gate electrode and is formed on the element separation insulating film; and
   a well that is formed on an upper surface of the semiconductor substrate,
   wherein a portion of the element separation insulating film abuts the well,
   wherein the gate electrode, the source region, and the drain region constitute a field effect transistor,
   wherein the gate leading-out interconnection is separated from one of the source region and the drain region in plan view,
   wherein a first side, a second side and a third side of the source region is surrounded by the well in plan view, and a first side, a second side and a third side of the drain region is surrounded by the well in plan view,
   wherein a fourth side of the source region is electrically connected to a drain electrode and a fourth side of the drain region is electrically connected to a source electrode, and
   wherein the fourth side of the source region is electrically connected to the drain electrode via a plug and the fourth side of the drain region is electrically connected to the source electrode via a second plug.

2. The semiconductor device according to claim 1,
   wherein the gate leading-out interconnection is separated from the source region when viewed from above.

3. The semiconductor device according to claim 1, further comprising:
   a well that is formed on the upper surface of the semiconductor substrate and on an upper surface of which the source region and the drain region are formed; and
   a first semiconductor region that is formed on the first region which overlaps an end portion in a gate width direction of the gate electrode when viewed from above, and that has a higher concentration of impurities than the well,
   wherein the well and the first semiconductor region have different conductivity than the source region and the drain region.

4. The semiconductor device according to claim 3,
   wherein the first semiconductor region is electrically connected to the source region.

5. The semiconductor device according to claim 3, further comprising:
   a first electrode that is formed right over the first semiconductor region with the element separation insulating film in between,
   wherein the same electric potential as is applied to the first semiconductor region is applied to the first electrode.

6. The semiconductor device according to claim 4, further comprising:
   a source electrode that is formed right over the first semiconductor region with the element separation insulating film in between, and is electrically connected to the source region.

7. The semiconductor device according to claim 3, further comprising:
   an element separation region that is formed on the upper surface of the semiconductor substrate, and is a second semiconductor region that surrounds the well, the source region, and the drain region when viewed from above,
   wherein the element separation region has the same conductivity as the well, and
   wherein the element separation region and the first semiconductor region are in contact with each other.

8. The semiconductor device according to claim 1,
   wherein a length of the gate leading-out interconnection is smaller in a gate length direction of the gate electrode than a length of the gate electrode.

9. The semiconductor device according to claim 1,
wherein the semiconductor substrate is made of a material that has a wider band gap than silicon.

10. The semiconductor device according to claim 1, wherein
the source region and the drain region are formed from an upper surface of the well to a middle of a depth of the well.

11. The semiconductor device according to claim 10, wherein the well separates the source region and the drain region.

12. The semiconductor device according to claim 1, further comprising:
an element separation region that is formed on the upper surface of the semiconductor substrate and in the well.

13. The semiconductor device according to claim 12, wherein
the element separation region that is formed on the upper surface of the semiconductor substrate and surrounds the source region and the drain region.

* * * * *